(12) United States Patent
Kumura (10) Patent No.: US 7,893,851 B2
(45) Date of Patent: Feb. 22, 2011

(54) ENCODING APPARATUS, METHOD, AND PROCESSOR

(75) Inventor: Takahiro Kumura, Tokyo (JP)

(73) Assignee: NEC Corporation, Tokyo (JP)

( * ) Notice: Subject to any disclaimer, the term of this patent is extended or adjusted under 35 U.S.C. 154(b) by 84 days.

(21) Appl. No.: 12/516,585

(22) PCT Filed: Nov. 27, 2007

(86) PCT No.: PCT/JP2007/072870

§ 371 (c)(1),
(2), (4) Date: May 28, 2009

(87) PCT Pub. No.: WO2008/066050

PCT Pub. Date: Jun. 5, 2008

(65) Prior Publication Data

US 2010/0019941 A1    Jan. 28, 2010

(30) Foreign Application Priority Data

Nov. 28, 2006    (JP)    ............................. 2006-320278

(51) Int. Cl.
*H03M 7/00*    (2006.01)

(52) U.S. Cl. .............................. 341/59; 341/60; 341/61; 341/65; 341/67; 341/107; 382/233; 382/240; 382/245; 382/250; 375/240.12; 375/240.23

(58) Field of Classification Search .................. 341/59, 341/65, 67, 107; 382/240, 245, 233, 250; 375/240.12, 240.2, 240.5

See application file for complete search history.

(56) References Cited

U.S. PATENT DOCUMENTS 5,283,840 A * 2/1994 Kitamura et al. ............ 382/282
5,682,152 A * 10/1997 Wang et al. .................... 341/50
5,821,887 A * 10/1998 Zhu ............................. 341/67

(Continued)

FOREIGN PATENT DOCUMENTS

JP    2001102937 A    4/2001

(Continued)

OTHER PUBLICATIONS

International Search Report for PCT/JP2007/072870 mailed Jan. 8, 2008.

*Primary Examiner*—Linh V Nguyen (57) ABSTRACT

Disclosed is an apparatus in which there are provided a first storage unit for storing signals to which indexes are given in order to distinguish each of a plurality of signals that are to be coded; a first index computing unit for computing first indexes of non-zero signals among the signals stored in the first storage unit; a second index computing unit for computing second indexes from a base index and the first indexes; a second index storage position search unit for searching for a storage position in a second storage unit in which the second indexes are to be stored based on values of the indexes stored in the second storage unit; a second index preserving unit for preserving the second index in the second storage unit based on a storage position searched for by the second index storage position search unit; and a control unit for giving the base index to the second index computing unit and for controlling operation of the first index computing unit, the second index computing unit the second index storage position search unit, and the second index preserving unit.

14 Claims, 6 Drawing Sheets

U.S. PATENT DOCUMENTS

| | | | |
|---|---|---|---|
| 6,529,554 B1 * | 3/2003 | Craver | 375/240.23 |
| 6,707,398 B1 * | 3/2004 | Lin et al. | 341/67 |
| 6,947,592 B2 * | 9/2005 | Ishikawa | 382/166 |
| 7,079,698 B2 * | 7/2006 | Kobayashi | 382/250 |
| 7,174,047 B2 * | 2/2007 | Lin et al. | 382/250 |
| 7,177,478 B2 * | 2/2007 | Ville et al. | 382/245 |
| 7,298,297 B1 * | 11/2007 | Li | 341/65 |
| 7,327,290 B1 * | 2/2008 | Li | 341/65 |
| 7,397,957 B2 * | 7/2008 | Kim et al. | 382/232 |

FOREIGN PATENT DOCUMENTS

| | | |
|---|---|---|
| JP | 2003330911 A | 11/2003 |
| JP | 2004166083 A | 6/2004 |
| JP | 2005252408 A | 9/2005 |
| JP | 2006086676 A | 3/2006 |

* cited by examiner

16 SIGNALS (N = 16)

| s(15) | s(14) | s(13) | s(12) | s(11) | s(10) | s(9) | s(8) | s(7) | s(6) | s(5) | s(4) | s(3) | s(2) | s(1) | s(0) |
|---|---|---|---|---|---|---|---|---|---|---|---|---|---|---|---|
| 0 | 0 | 0 | 0 | -1 | 0 | +1 | 0 | 0 | -3 | +8 | 0 | 0 | +11 | -4 | +23 |

OBTAIN INDEXES x(k) OF NON-ZERO SIGNALS

FIG.6B

INDEXES OF NON-ZERO SIGNALS x(k)

| x(15) | x(14) | x(13) | x(12) | x(11) | x(10) | x(9) | x(8) | x(7) | x(6) | x(5) | x(4) | x(3) | x(2) | x(1) | x(0) |
|---|---|---|---|---|---|---|---|---|---|---|---|---|---|---|---|
| -16 | -16 | -16 | -16 | -16 | -16 | -16 | -16 | -16 | 11 | 9 | 6 | 5 | 2 | 1 | 0 |

ASSIGN x(k) TO a(k), SHIFT a(k) ONE ELEMENT TO THE LEFT, AND ASSIGN 0 TO a(0)

FIG.6C a(k)

| -16 | -16 | -16 | -16 | -16 | -16 | -16 | -16 | 11 | 9 | 6 | 5 | 2 | 1 | 0 | 0 |
|---|---|---|---|---|---|---|---|---|---|---|---|---|---|---|---|

ASSIGN THE DIFFERENCE BETWEEN EACH ELEMENT OF x(k) AND ELEMENTS CORRESPONDING TO a(k) TO b(k).

FIG.6D b(k)

| 0 | 0 | 0 | 0 | 0 | 0 | 0 | 0 | -27 | 2 | 3 | 1 | 3 | 1 | 1 | 0 |
|---|---|---|---|---|---|---|---|---|---|---|---|---|---|---|---|

THE SUM OF EACH ELEMENT OF b(k) AND 2N = 32 IS TAKEN AS c(k).

FIG.6E c(k)

| 32 | 32 | 32 | 32 | 32 | 32 | 32 | 32 | 35 | 34 | 35 | 33 | 35 | 33 | 33 | 32 |
|---|---|---|---|---|---|---|---|---|---|---|---|---|---|---|---|

LOWER 4 BITS OF EACH ELEMENT OF c(k) ARE EXTRACTED, AND THESE ARE TAKEN AS d(k)

FIG.6F d(k)

| 0 | 0 | 0 | 0 | 0 | 0 | 0 | 0 | 5 | 2 | 3 | 1 | 3 | 1 | 1 | 0 |
|---|---|---|---|---|---|---|---|---|---|---|---|---|---|---|---|

THE DIFFERENCE BETWEEN EACH ELEMENT OF d(k) AND 1 IS TAKEN AS e(k).

FIG.6G e(k)

| -1 | -1 | -1 | -1 | -1 | -1 | -1 | -1 | 4 | 1 | 2 | 0 | 2 | 0 | 0 | -1 |
|---|---|---|---|---|---|---|---|---|---|---|---|---|---|---|---| e(k) IS ASSIGNED TO z(k); z(k) IS SHIFTED ONE ELEMENT TO THE RIGHT; AND -1 IS SUBSTITUTED INTO z(15).

FIG.6H

RUN LENGTH z(k)

| z(15) | z(14) | z(13) | z(12) | z(11) | z(10) | z(9) | z(8) | z(7) | z(6) | z(5) | z(4) | z(3) | z(2) | z(1) | z(0) |
|---|---|---|---|---|---|---|---|---|---|---|---|---|---|---|---|
| -1 | -1 | -1 | -1 | -1 | -1 | -1 | -1 | -1 | 4 | 1 | 2 | 0 | 2 | 0 | 0 |

RUN LENGTH CORRESPONDING TO INDEXES x(k) OF NON-ZERO SIGNALS

ENCODING APPARATUS, METHOD, AND PROCESSOR

This application is the National Phase of PCT/JP2007/072870, filed Nov. 27, 2007 which is based upon and claims the benefit of the priority of Japanese Patent Application No. 2006-320278 (filed on Nov. 28, 2006), the disclosure of which is incorporated herein in its entirety by reference thereto.

TECHNICAL FIELD

The present invention relates to compression encoding technology, and in particular to a preferred encoding apparatus, method, processor, and program, for run-length encoding used in image and audio compression encoding.

BACKGROUND ART

Run-length encoding is an encoding scheme used when compressing image and music signals. For example, image encoding schemes such as JPEG (Joint Photographic Experts Group), MPEG-2 (Moving Picture Experts Group Phase-2), MPEG-4 (Moving Picture Experts Group Phase-4), H.264, and so forth, use run-length encoding.

The run-length encoding is applied to compression of signals in which zero appears frequently. The run-length encoding encodes the number of zeros appearing before a non-zero signal and the value of the non-zero signal, as one set of information.

Figure 5A:
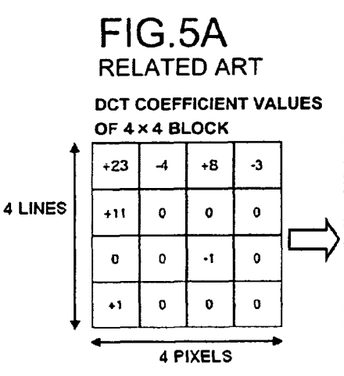
FIGS. 5A to 5C are diagrams respectively representing an encoding procedure for a 4×4 block for H.264.
Figure 5B:
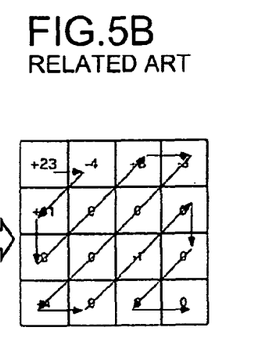
Figure 5C:
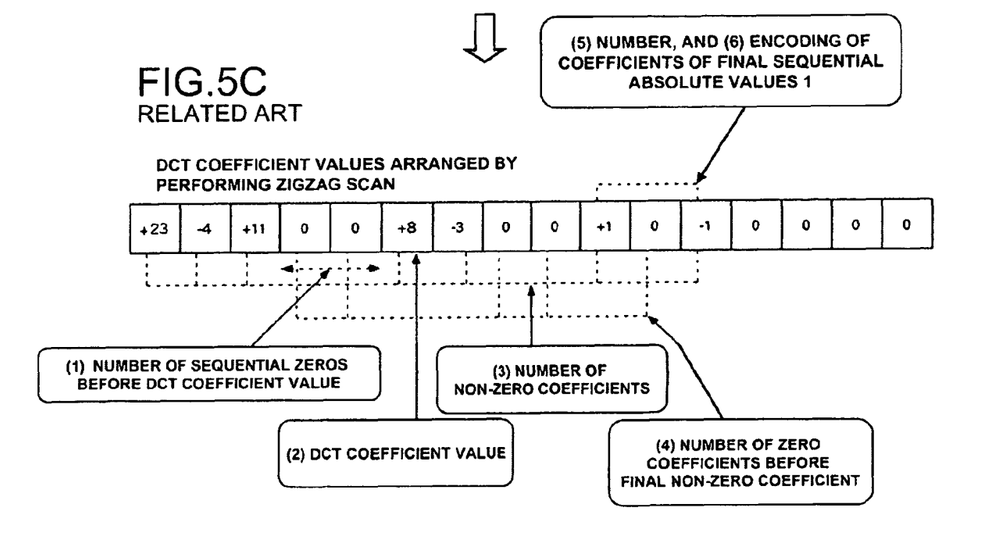

Run-length encoding will now be described, taking as an example an encoding scheme for a 4×4 block in a video encoding scheme H.264. FIGS. 5A to 5C are diagrams respectively illustrating an encoding procedure for the 4×4 block in the H.264. In FIG. 5A, the 4×4 block shows coefficients after a DCT (Discrete Cosine Transform). As shown in FIG. 5B, a zigzag scan is performed on the coefficients of the 4×4 block, to rearrange the coefficients as shown in FIG. 5C.

Non-zero coefficients and zero coefficients are found from among the rearranged coefficients, and information such as
(1) the number of zeros before each non-zero coefficient,
(2) the value of each non-zero coefficient, and
(3) the number of non-zero coefficients is extracted.

In order to efficiently extract the abovementioned information, (1), (2), and (3), positions of the non-zero coefficients should be found.

The positions of the non-zeros are indexes representing order of coefficients on which zigzag scanning and arranging has been performed. The index of a first coefficient is 0, the index of a subsequent coefficient is 1, the index of a next subsequent coefficient is 2, and so on.

When the indexes of the non-zero coefficients are known, it is possible to compute the number of non-zero coefficients, and the number of zeros before the non-zero coefficients.

However, processors such as conventional CPUs (Central Processing Units), DSPs (Digital Signal Processors), or the like, cannot obtain the indexes of the non-zero coefficients at high speed. Conventional CPUs and DSPs are said to be rather unsuitable for high speed processing of run-length encoding.

On processors such as CPUs, DSPs, or the like, indexes of the non-zero coefficients are normally found by scanning the coefficients in order. If the coefficients are scanned in order, time and effort are required according to the number of coefficients. As a result, the conventional processors cannot efficiently find indexes of the non-zero coefficients.

The run-length encoding, which requires a process of counting the number of zeros, is sequential processing. As a result, carrying out the run-length encoding in parallel is generally difficult.

If the process of counting the number of zeros can be performed in parallel, it is possible to speed up the run-length encoding on a processor to a greater extent than on conventional processors.

A method of performing the process of counting the number of zeros in parallel is disclosed in Patent Document 1. In the method disclosed in Patent Document 1, a signal is represented by a 1-bit flag as to whether a value is zero or not, and using a plurality of flags as one key, a run length is obtained from a run-length table. That is, the run-length table is used in order to obtain the run length. According to Patent Document 1, information of 256 elements is stored in the run-length table.

Obtaining the run length by the method of Patent Document 1 enables the obtaining of the run length with fewer steps than by obtaining the run length while scanning the signal in order.

Patent Document 2 discloses an encoding apparatus and method tor executing the run-length encoding. The run-length encoding apparatus of Patent Document 2 obtains the run length in the procedure of:
(a) a zero judgment of an input signal, and
(b) a run length computation.

A process of (a) decides whether or not zero is present for all input signals, and stores a decision result thereof. Then, based on this decision result, the number of zeros present before a non-zero signal, is computed.

[Patent Document 1]
  JP Patent Kokai Publication No. JP-P2003-330911A

[Patent Document 2]
  JP Patent Kokai Publication No. JP-P2004-166083A

SUMMARY

The disclosures of the abovementioned Patent Documents 1 and 2 are incorporated herein by reference thereto. An analysis of the related art given by the present invention is as follows.

A method of the abovementioned Patent Document 1 requires a run-length table. The run-length table is a relatively small table holding information of 256 elements. However, an operation of referring to the run-length table is a main cause of cache miss-hit on a processor. Also, in the method of Patent Document 1, obtaining a run length takes many steps. For example, according to Patent Document 1 (refer to FIG. 7 of Patent Document 1 and a related description), it takes about 10 steps to obtain one run length.

On the other hand, in a case of an encoding apparatus of the abovementioned Patent Document 2, it is necessary to store a zero decision result in a storage means for all input signals. In case in which the zero decision results for all the input signals are stored, it is necessary that the maximum number of input signals be known in advance. In addition, a storage means is necessary for storing the zero decision results of all the input signals. In case in which there are many input signals, the capacity of the storage means becomes large. As one example, in case in which the number of input signals is 16×16=256, a storage means for storing zero decision results of 256 bits is necessary.

However, if only indexes of non-zero signals are stored, the storage means content can be made small.

As described above, there is a problem in that the related art processor/encoding apparatuses cannot efficiently execute run-length encoding.

More specifically, there are problems such as:

a run-length table is necessary, the number of steps for obtaining a run length is large, and a storage means is necessary for storing zero decision results for all signals.

Accordingly, a principal object of the present invention is to provide an apparatus, method, processor, and program, that can effectively obtain a position of a non-zero signal in run-length encoding.

The present invention may be summarized as follows.

An encoding apparatus according to the present invention is an encoding apparatus for performing run-length encoding of signals that are to be encoded, the encoding apparatus being provided with:

a first, storage unit for storing signals to which indexes are given in order to distinguish each of a plurality of signals that are to he encoded;

a second storage unit for storing the indexes of non-zero signals;

a first index computing unit for computing first indexes of non-zero signals among the signals stored in the first storage unit;

a second index computing unit for computing second indexes from a base index and the first indexes;

a second index storage position search unit for searching for a storage position in the second storage unit in which the second indexes are to be stored, based on values of the indexes stored in the second storage unit;

a second index preserving unit for preserving the second index in the second storage unit, based on a storage position searched for by the second index storage position search unit; and a control unit for giving the base index to the second index computing unit and for controlling operation of each of the first index computing unit, the second index computing unit, the second index storage position search unit, and the second index preserving unit.

In the encoding apparatus of the present invention, the second index storage position search unit may also be provided with a unit for searching for a storage position such that the second indexes are stored in ascending order or descending order in the second storage unit. The encoding apparatus of the present invention may also be provided with a unit for computing a difference between adjacent elements of indexes of non-zero signals stored in the second storage unit, and a unit for obtaining the number of zeros before a non-zero signal by subtracting 1 from the difference between the elements.

A processor of the present invention is provided with a register file, a non-zero signal detection unit, and an instruction decoder;

indexes of 0 to S−1 are assigned to S signals on which run-length encoding is to be performed, and N (where N is an integer that is greater than or equal to 2 and less than or equal to S) signals s(n) (n=0 to N−1) extracted from the S signals are stored in a first register of the register file, with the index of signal s(0) of the N signals as a base index, K (where K is a positive integer smaller than the total number of S signals) initialized indexes x(k) (k=0 to K−1) are stored in advance in a second register of the register file, when a decoded instruction is a non-zero signal detection instruction, the instruction decoder makes the non-zero signal detection unit operate, the instruction decoder gives the base index to the non-zero signal detection unit, and the non-zero signal detection unit is provided with:

a first unit for reading signals s(n) (n=0 to N−1) from the first register of the register file, and computing indexes p(m) (m=0 to M−1, M is the number of non-zero signals included in the signals s(n)) of non-zero signals, using the base index;

a second unit for using the indexes x(k) (k=0 to K−1) stored in the second register of the register file and the indexes p(m) of non-zero signals, to have post-update indexes y(k) (k=0 to K−1) obtained by adding the indexes p(m) to the indexes x(k); and a third unit for writing the post-update indexes y(k) (k=0 to K−1) to the second register.

In the processor according to the present invention, the second unit may take a negative index x(k) with the smallest k among the indexes x(k) (k=0 to K−1), as x(G), and, for the post-update indexes y(k) (k=0 to K−1), in cases of $0<=k<G$, the second unit may have $$y(k)=x(k);$$

in cases of $G<=k<(G+M)$, may have $$y(k)=p(k-G);$$

and in cases of $(G+M)<=k<K$, may have $$y(k)=x(k).$$

The processor according to the present invention may be configured to repeat processing in which:

the S signals that are to be encoded ate divided into L sets, each of which consists of N signals;

a prescribed value is stored in the second register to initialize the indexes x(k);

with a variable i=0, while incrementing i by 1, from 0 to L−1, an i-th of the N-signal set s(n) (n=0 to N−1) is stored in the first register;

with the base index as N×i, the non-zero signal detection unit is made to operate; and indexes of non-zero signals of the signals s(n) stored in the first register are added to the second register.

The processor according to the present invention may be configured such that, with the indexes x(k) of non-zero signals of the signals s(n) being shifted by one element in a direction in which a number k becomes larger, as a(k), the difference between x(k) and a(k), b(k)=x(k)−a(k) (k=0 to N−1), is obtained, next, the sum of b(k) and 2×N, c(k)=b(k)+2×N (k=0 to N−1), is obtained, next, a result of extracting a prescribed lower bit of c(k) is d(k), and e(k)=d(k)−1 (k=0 to N−1) is obtained, and with each element of e(k) being shifted by one element in a direction in which the number k becomes smaller, as z(k), z(k) is a run length corresponding to each element of x(k).

According to the present invention, there is provided an encoding method for run-length encoding of signals that are to be encoded, the method including a first index computing step which computes first indexes of non-zero signals among the signals that are stored in a first storage unit for storing signals to which indexes are given in order to distinguish each of a plurality of signals that are to be encoded;

a second index computing step of computing second indexes from a base index and the first indexes;

a second index storage position search step of searching, based on values of indexes stored in a second storage unit that stores indexes, for a storage position in the second storage unit in which the second indexes are to be stored;

a second index preserving step of preserving the second index in the second storage unit, based on a storage position searched for in the second index storage position search step; and a step of giving the base index to the second index computing step, and of controlling operation of each of the first index computing step, the second index computing step, the second index storage position search step, and the second index preserving step.

According to the present invention, there is provided a program that causes a computer constituting an encoding apparatus for performing run-length encoding of signals to be encoded: to execute a first index computing processing which computes first indexes of non-zero signals among signals that are stored in a first storage unit for storing signals to which indexes are given in order to distinguish each of a plurality of signals that are to be encoded;

a second index computing processing which computes second indexes from a base index and the first indexes;

a second index storage position search processing which searches for a storage position in a second storage unit in which the second indexes are to be stored, based on values of indexes stored in the second storage unit for storing the indexes;

a second index preserving processing which preserves the second index in the second storage unit, based on a storage position searched for in the second index storage position search process; and a processing which gives the base index to the second index computing process and of controlling operation of each of the first index computing processing, the second index computing processing, the second index storage position search processing, and the second index preserving processing.

According to the present invention, it is possible to efficiently execute processing to obtain a position of a non-zero signal in run-length encoding. The reason for this is because, with regard to obtaining the position of the non-zero signal in the run-length encoding, it is possible to perform execution in fewer steps in comparison to the related art apparatuses, without using a run-length table. According to the present invention, a storage unit for storing zero decision results of all signals is unnecessary.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES

Figure 1:
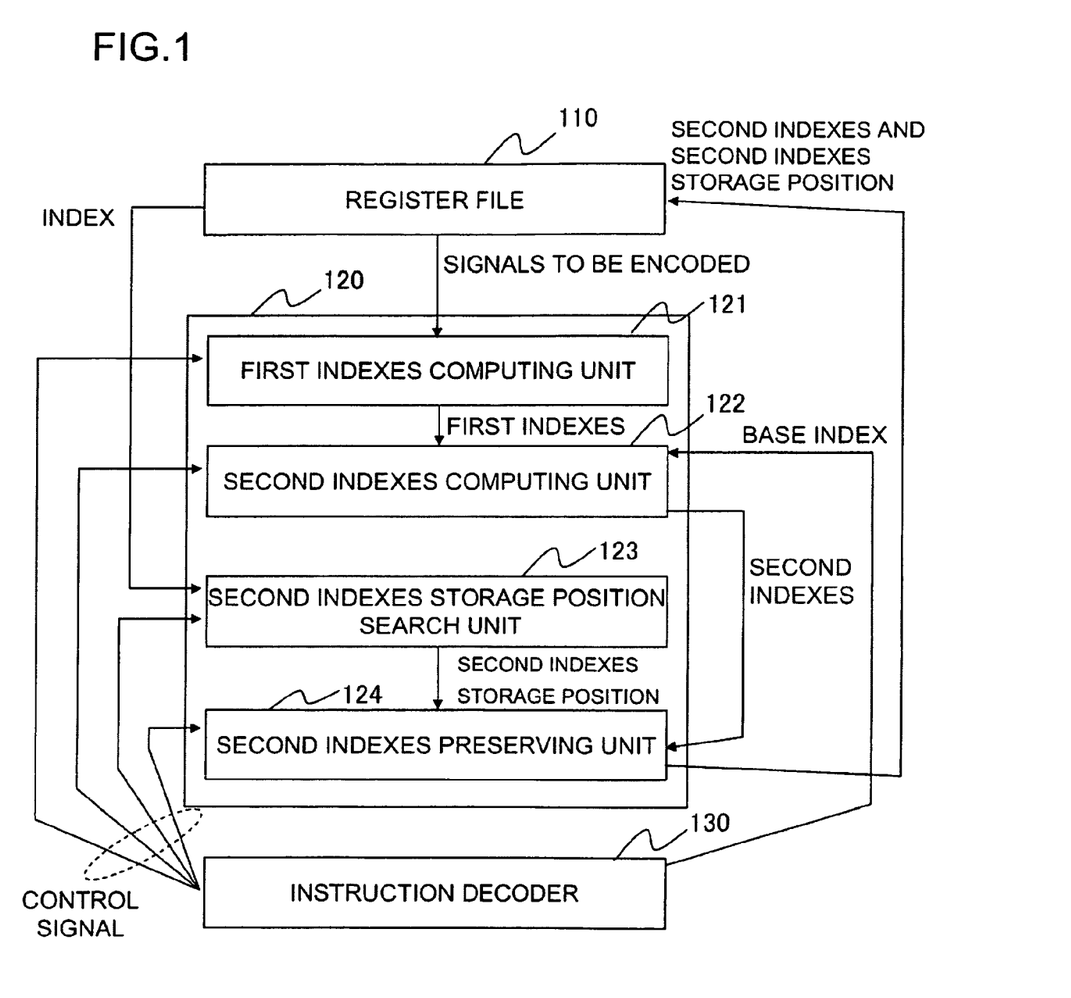
FIG. 1 is a diagram representing a configuration of one exemplary embodiment of the present invention.
Figure 2:
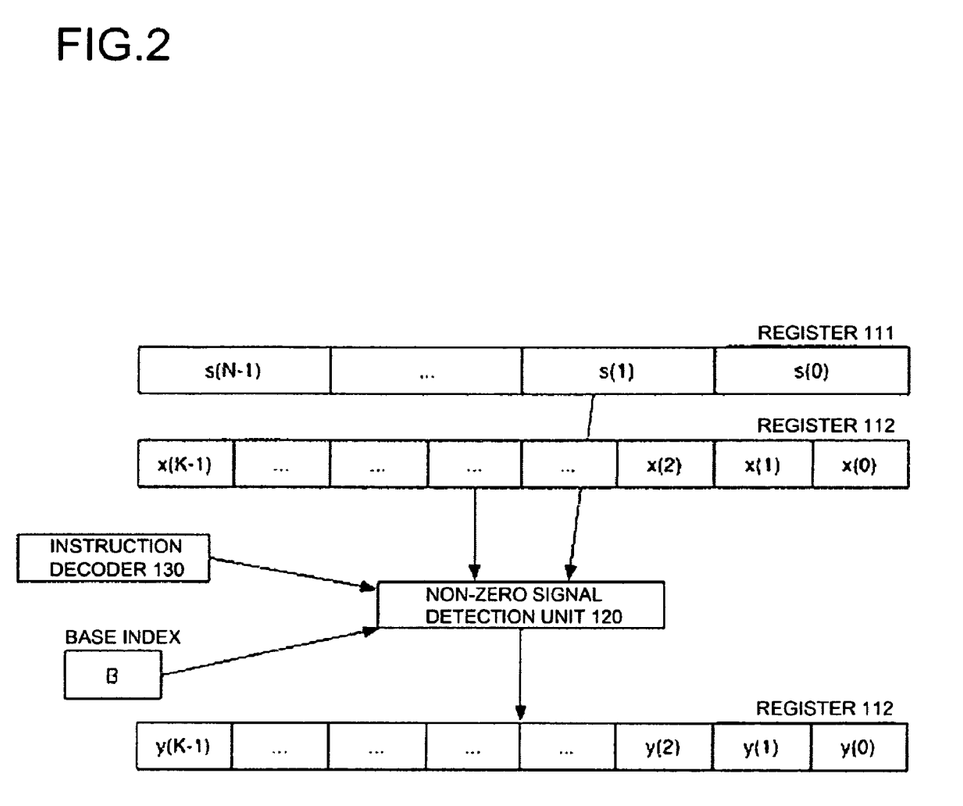
FIG. 2 is a diagram for describing operation of a non-zero signal detection unit of one exemplary embodiment of the present invention.

The present invention as described above is described in further detail below, making reference to the attached diagrams. According to the present invention, there is provided a processor that can operate as an encoder for run-length encoding. The processor includes:

a first storage unit (110 in FIG. 1, 111 in FIG. 2) for storing N signals;

a second storage unit (110 in FIG. 1, 112 in FIG. 2) for storing a plurality of indexes;

a first index computing unit (121 in FIG. 1) for obtaining a first index of a non-zero signal from the N signals stored in the first storage unit;

a second index computing unit (122 in FIG. 1) that has the sum of a base index and the first index as a second index;

a second index storage position search unit (123 in FIG. 1) for searching for a storage position in the second storage unit (110 in FIG. 1, 112 in FIG. 2) in which the second indexes are to be stored, based on values of the indexes stored in the second storage unit (110 in FIG. 1, 112 in FIG. 2);

a second index preserving unit (124 in FIG. 1) for storing the second index in the second storage unit (112 in FIG. 2), based on a storage position searched for by the second index storage position search unit (123 in FIG. 1); and an instruction decoder (130 in FIG. 1) for giving the base index corresponding to an instruction word to the second index computing unit, responsive to an instruction supplied to the processor, and for controlling operation of the first index computing unit, the second index computing unit, the second index storage position search unit, and the second index preserving unit. A detailed description will be given according to the following exemplary embodiment.

FIG. 1 is a diagram showing a configuration of one exemplary embodiment of the present invention. Referring to FIG. 1, a processor of the present exemplary embodiment is provided with a register file 110, a non-zero signal detection unit 120, and an instruction decoder 130, and executes run-length encoding.

The register file 110 includes a plurality of registers. The registers of the register file 110 store two types of data, as follows, that are necessary for run-length, encoding.

N signals on which the run-length encoding is to be performed.

Indexes of non-zero signals generated in a process of performing the run-length encoding.

The non-zero signal detection unit 120 reads the N signals on which the run-length encoding is to be performed from the register file 110, and indexes of non-zero signals.

The non-zero signal detection unit 120 reads a base index given by the instruction decoder 130, obtains the indexes of non-zero signals of the N signals, updates indexes read from the register file 110, based on the obtained indexes, and stores the updated indexes in the register file 110.

The non-zero signal detection unit 120 is provided with a first index computing unit 121, a second index computing unit 122, a second index storage position search unit 123, and a second index preserving unit 124.

The first index computing unit 121 reads N signals on which the run-length encoding is to be performed, from the register file 110, and the indexes of the non-zero signals, and obtains a first index of a non-zero signal from among the N signals.

The second index computing unit 122 computes the sum of the first index obtained by the first index computing unit 121 and the base index given by the instruction decoder 130 of the processor. The resulting sum of the first index and the base index is taken as a second index.

The second index storage position search unit 123 searches for which position in the register file 110 the second index should be stored at, based on values of indexes stored in the register file 110.

The second index preserving unit 124 stores the second index in the register file 110, based on a storage position searched for by the second index storage position search unit 123.

The instruction decoder 130 is a unit that decodes an instruction. The instruction decoder 130 responds to an instruction for obtaining the indexes of non-zero signals, gives a base index corresponding to an instruction word to the second index computing unit 122, and makes the first index computing unit 121, the second index computing unit 122, the second index storage position search unit 123, and the second index preserving unit 124 operate.

Operation of the present exemplary embodiment will now be described. Below, it is assumed that there are S signals on which the run-length encoding is to be performed.

In the present exemplary embodiment, the S signals on which the run-length encoding is to be performed are divided into a plurality of signal groups formed of N signals. It is to be noted that N<=S. If S is equal to N, the number of signal groups is only one.

A procedure for obtaining indexes of non-zero signals included in the N signals will now be described. By repeating this procedure for all of the signal groups that have been divided into groups of each N signals, it is possible to obtain the indexes of the non-zero signals included in the S signals.

First, one signal group is extracted from S signals on which the run-length encoding is to be performed. The N signals, s(n) (n=0, 1, 2, ... N−1), included in this signal group are stored In the register file 110.

An index of the first signal s(0) of the N signals s(n) is assumed to be B. B denotes a base index of the signals s(n) (n=0, 1, 2, ... N−1).

Indexes of non-zero signals corresponding to signals from index 0 to B−1 of the S signals are stored in the register file 110. The indexes of non-zero signals stored in the register file 110 are represented as x(k) (k=0, 1, 2, ... K−1). The number K of the indexes x(k) shall be greater than or equal to the number N of signals (N<=K).

Generally, in the run-length encoding, frequency of appearance of zero signals is high, and frequency of appearance of non-zero signals is low. Therefore, in general the number K of the indexes of non-zero signals is less than the total number S of signals (K<S).

A normal non-zero signal index has a value greater than or equal to 0. Using this fact, a decision is made as to whether or not an index is a normal non-zero signal index.

Before starting all computations, the K indexes of the non-zero signals x(k) (k=0, 1, 2, ... K−1) stored in the register file 110 are initialized to a negative value. For example, −1 is assigned to x(k).

The indexes of the non-zero signals found from the signals s(n) (n=0, 1, 2, ... N−1) are stored in x(k) by an operation described below.

After finding all of the indexes of the non-zero signals included in the S signals, the normal indexes of non-zero signals x(k) have a value greater than or equal to 0, and the x(k) that are as initialized have a negative value.

The processor of the present exemplary embodiment has a non-zero signal detection instruction. The non-zero signal detection instruction can obtain indexes of non-zero signals included in the signals s(n).

If a decoded instruction is a non-zero signal detection instruction, the instruction decoder 130 makes the non-zero signal detection unit 120 operate. In the present invention, processing of each unit 121 to 124 of the non-zero signal detection unit 120 may be realized by a program of the processor (computer).

The operation of the non-zero signal detection unit 120 will now be described with reference to FIG. 2. The non-zero signal detection unit 120 receives three items of information as follows, from the instruction decoder 130.

(1) The base index B of the signals s(n).
(2) A register number where the signals s(n) are stored (the number of a register of the register file 110 of FIG. 1). In the present exemplary embodiment, s(n) (n=0, 1, ... N−1) are stored in the register 111 in FIG. 2.
(3) The register number at which the indexes x(k) of non-zero signals are stored (the number of the register in the register file 110 in FIG. 1). In the present exemplary embodiment, x(k) (k=0, 1, 2, ... K−1) are stored in the register 112 in FIG. 2.

The non-zero signal detection unit 120 reads the signals s(n) (n=0, 1, 2, ... N−1) from the register 111.

Using the base index B, the indexes of the signals s(n) (n=0, 1, 2, ... N−1) are defined as B+0, B+1, B+2, ... B+N−1.

The non-zero signal detection unit 120 scans the signals s(n) (n=0 to N−1) and obtains indexes of non-zero signals.

The indexes of the obtained non-zero signals shall be denoted as p(m) (m=0, 1, 2, ... M−1). M is the number of non-zero signals included in the signals s(n) (n=0, 1, ... N−1).

Furthermore, the index p(m+1) shall be greater than or equal to the index p(m), (p(m)<=p(m+1)).

Next, the non-zero signal detection unit 120 reads the indexes x(k) (k=0, 1, ... K−1) from the register 112.

The non-zero signal detection unit 120 scans x(k) (k=0 to K−1), and takes a negative index x(k) with the smallest k as x(G). Since the indexes x(k) after the index x(G) (where G<=k) are indexes that hold a negative value, they are indexes that remain in a state as initialized.

if there is no negative index among the K indexes x(k) (k=0, 1, ... K−1), G has an undefined value.

Next, the non-zero signal detection unit 120 uses x(k) and p(m) to update the indexes x(k) (k=0, 1, 2, ... K−1) as below. The post-update indexes shall be denoted as y(k) (k=0, 1, 2, ... K−1).

$$y(k) = x(k) \text{ if } 0 <= k < G; \quad (1)$$
$$y(k) = p(k - G) \text{ if } G <= k < (G + M); \text{ and}$$
$$y(k) = x(k) \text{ if } (G + M) <= k < K$$

That is, by appending the indexes p(m) of non-zero signals included in the signals s(n) to the pre-update indexes x(k), the post-update indexes y(k) are obtained.

In order to correctly compute y(k), it is necessary that a relationship of $$(G+M) \leq K \quad (2)$$

holds between G, K, and M.

In the present exemplary embodiment, when the non-zero signal detection unit 120 is used, it is necessary that this relationship always be satisfied.

If a relationship of $$K < (G+M) \quad (3)$$

holds, the post-update indexes y(k) have a value that is undefined.

Finally, the non-zero signal detection unit 120 writes the post-update indexes y(k) (k=0, 1, 2, ... K−1) to the register 112.

According to the abovementioned procedure, it is possible to obtain the indexes of non-zero signals of the N signals s(n) (n=0, 1, 2, ... N−1) included in one signal group.

Figure 4:
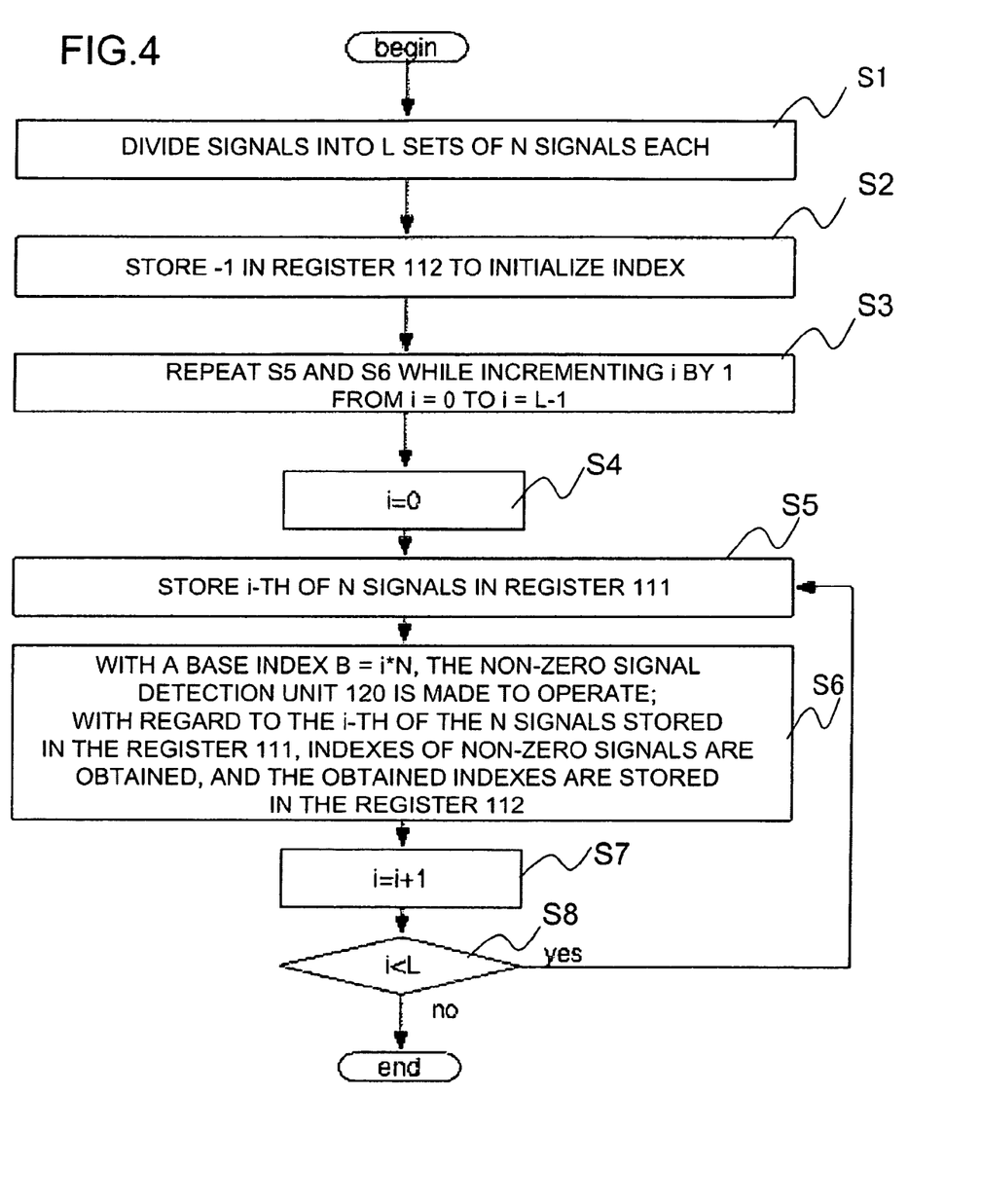
FIG. 4 is a diagram for describing a procedure for obtaining an index of a non-zero signal from a number of signals larger than N, in one exemplary embodiment of the present invention.

The procedure for obtaining the indexes of non-zero signals with regard to the S signals is summarized as follows. FIG. 4 is a diagram schematically showing the procedure of the present exemplary embodiment.

The signals are divided into L sets of each N signals (step S1 in FIG. 4).

In order to initialize the indexes, −1 is stored in the register 112 (step S2 in FIG. 4). The register 112 contains the indexes x(k) of non-zero signals.

With i=0 (step S4 in FIG. 4), while incrementing i by 1 up to L−1 (step S7 in FIG. 4), processing of steps S5 and S6 is repeated.

The i-th of the N-signal set s(n) (n=0, 1, ... N−1) is stored in the register 111 (step S5 in FIG. 4).

With the base index B as N×i, the non-zero signal detection unit 120 is made to operate, the indexes of non-zero signals of the N signals of s(n) stored in the register 111 are obtained, and the obtained indexes are stored in the register 112 (step S6 in FIG. 4). Next, 1 is added to i (step S7 in FIG. 4); if i<L, then the procedure returns to step S5 ("yes" branch in step S8 in FIG. 4), if L<=i, then the procedure ends ("no" branch in step S8 in FIG. 4).

In case in which there are N or more negative indexes in the register 112, in the abovementioned step S6 there is no overflow of indexes of non-zero signals from the register 112.

In case in which there are not N or more negative indexes in the register 112, in the processing of step S6 in FIG. 4 there is a possibility of overflowing of indexes of non-zero signals from the register 112. It is necessary to perform appropriate processing between step S5 and step S6 in FIG. 4.

Specifically, the following processing steps are inserted between step S5 and step S6 in FIG. 4.

(a) N or more non-negative indexes stored in the register 112 are saved to memory.

(b) Next, right shift arithmetic is performed on the register 112 so that non-negative indexes stored to the memory are shifted out from the register.

In this way, the non-zero signal detection unit 120 can obtain the indexes of non-zero signals of the S signals.

However, in cases in which it is expected that the number of non-zero signals exceeds K, it is necessary to make an arrangement such that the indexes of the non-zero signals do not overflow from the register 112.

Figure 3:
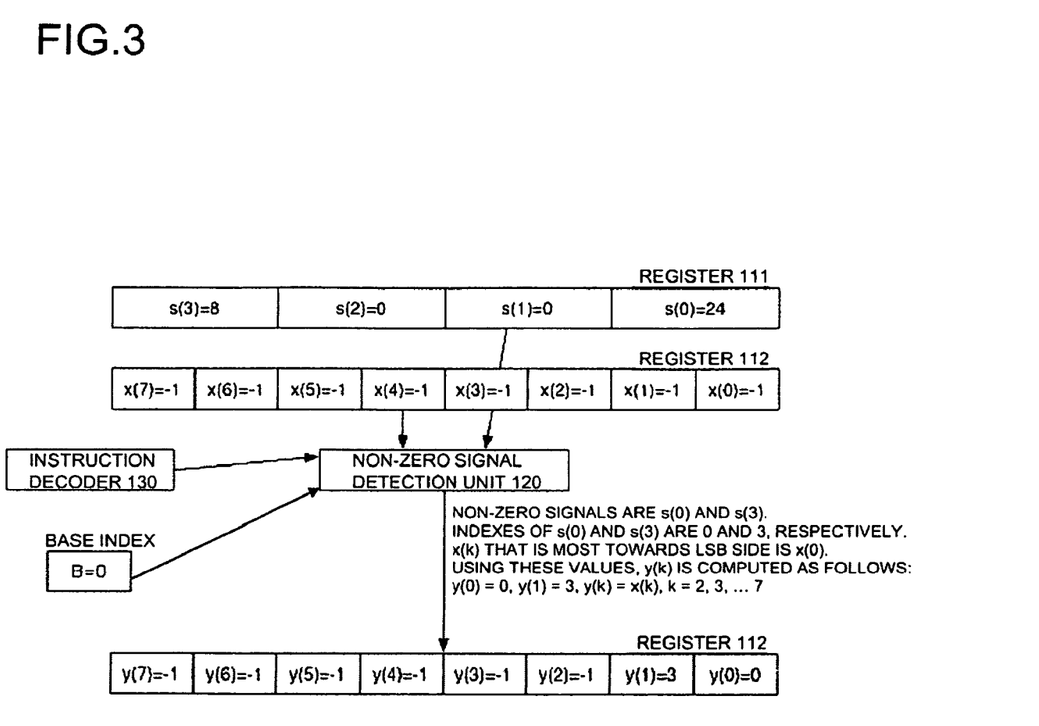
FIG. 3 is a diagram for describing operation of one exemplary embodiment of the present invention.

Next, making reference to FIG. 3, operation of the present exemplary embodiment is described specifically.

In the following description, the register file 110 has 16 64-bit registers, and the register 111 and the register 112 are each 64-bit registers.

Processing for obtaining the indexes of non-zero signals x(k) included in N=4 signals s(n) (n=0, 1, 2, 3) is described. However, the signals s(n) are 16-bit signed integers, and the indexes x(k) are 8-bit signed integers.

Before obtaining the indexes, initial values of the indexes and the signals are stored to the register. The N=4 signals s(n) (n=0, 1, 2, 3) are stored to the register 111.

s(0)=24;
s(1)=0;
s(2)=0;
s(3)=8;

It is assumed that on the LSB (Least Significant Bit) side of the register 111, s(0) is stored, and on the MSB (Most Significant Bit) side, s(3) is stored.

Initial values of 8 non-zero signal indexes x(k) (k=0, 1, 2, ... 7) are −1. These indexes x(k) are stored in the register 112.

Next, with the base index B=0, the non-zero signal detection unit 120 is made to operate.

Thereupon, the non-zero signal detection unit 120 reads each of the signals s(n) (n=0, 1, 2, 3) from the register 111, and the indexes of non-zero signals x(k) (k=0, 1, 2, ... 7) from the register 112.

The non-zero signal detection unit 120 scans the signals s(n) (n=0, 1, 2, 3), and finds the indexes p(m) (m=0, 1, 2, ... M−1) of non-zero signals.

Among the signals s(n), the non-zero signals are s(0) and s(3). The indexes of the signals s(0), s(1), s(2), s(3) are, respectively in order from the LSB side of the register 111, B+0, B+1, B+2, B+3, and the base index B given to the non-zero signal detection unit 120 is 0, so that the index of s(0) is p(0)=0; and
the index of s(3) is p(1)=3.

Next, the non-zero signal detection unit 120 scans the indexes x(k), and finds the negative index x(G) that is most towards the LSB side in the register 112. In this state, since all of the indexes x(k) are −1, the negative index x(G) that is most towards the LSB side is x(G)=x(0).

Next, the non-zero signal detection unit 120 uses the indexes x(k) read from the register 112 and the indexes p(m) obtained from the signals s(n), to update the indexes x(k).

With regard to the indexes x(k) read from the register 112, since the negative index that is most towards the LSB side is x(G)=x(0), the non-zero signal detection unit 120 computes the post-update indexes y(k) (k=0, 1, 2, ... 7) as follows.

y(0)=p(0)=0;
y(1)=p(1)=3;
y(2)=x(2)=−1;
y(3)=x(3)=−1;
y(4)=x(4)=−1;
y(5)=x(5)=−1;
y(6)=x(6)=−1;
y(7)=x(7)=−1;

Finally, the non-zero signal detection unit 120 writes the post-update indexes y(k) (k=0, 1, 2, ... 7) to the register 112.

In the abovementioned way, it is possible to obtain the indexes of non-zero signals included in N=4 signals s(n) (n=0, 1, 2, 3).

As described above, the present exemplary embodiment can obtain the indexes of non-zero signals from signals larger than N in number. In case in which the number of signals is larger than N, the signals are divided into L signal groups with N signals in each, to obtain the indexes of the non-zero signals.

For example, in cases in which the number of signals is 2×N, division is performed twice to obtain the indexes of non-zero signals.

In the following exemplary embodiment, with N=4, and the number of signals S=8, a procedure for obtaining the indexes of non-zero signals is described. In such cases, since S=L×N=2×4, division is perforated twice to obtain the indexes of the non-zero signals.

In the following, similar to the abovementioned exemplary embodiment 1, the register file 110 has 16 64-bit registers, and the register 111 and the register 112 are each 64-bit registers.

Furthermore, the signals s(n) are 16-bit signed integers, and the indexes x(k) are 8-bit signed integers.

The values of the 8 signals s(n) (n=0, 1, 2, . . . 7) are defined as follows.

Among the 8 signals, the values of the first 4 signals s(n) (n=0, 1, 2, 3) are the same as the abovementioned exemplary embodiment 1.

s(0)=24;
s(1)=0;
s(2)=0;
s(3)=8;
s(4)=0;
s(5)=−11;
s(6)=0;
s(7)=0;

Configuration of the register file 110 and the values of the signals s(n) (n=0, 1, 2, 3) are the same as the abovementioned exemplary embodiment 1. Exactly the same as for exemplary embodiment 1, it is possible to obtain the indexes of non-zero signals of the signals s(n) (n=0, 1, 2, 3).

Therefore, similar to the abovementioned exemplary embodiment 1, the N=4 signals s(n) (n=0, 1, 2, 3) are stored in the register 111, and initial values of the indexes of non-zero signals are stored in the register 112, respectively; and with the base index B=0, if the non-zero signal detection unit 120 is made to operate, the following indexes of non-zero signals are obtained in the register 112. This is the same result as for the abovementioned exemplary embodiment 1.

y(0)=0;
y(1)=3;
y(2)=−1;
y(3)=−1;
y(4)=−1;
y(5)=−1,
y(6)=−1;
y(7)=−1;

Next, the indexes of non-zero signals included in the N=4 signals s(n) (n=4, 5, 6, 7) of another set are obtained.

The signals s(n) (n=4, 5, 6, 7) are stored in the register 111; the indexes y(k) (k=0, 1, 2, . . . 7) of the register 112 are regarded as new indexes x(k) (k=0, 1, 2, . . . 7); and with the base index B=4, the non-zero signal detection unit 120 is made to operate.

The non-zero signal detection unit 120 reads each of the signals s(n) (n=4, 5, 6, 7) from the register 111, and the indexes x(k) (k=0, 1, 2, . . . 7) of non-zero signals from the register 112.

The non-zero signal detection unit 120 scans the signals s(n), and finds the indexes p(m) (where m=0, 1, 2, . . . M−1) of non-zero signals.

Among the signals s(n), only s(5) is a non-zero signal.

The indexes of the signals s(n) are, respectively, B+0, B+1, B+2, and B+3, in order, from the LSB side of the register 111. Since the base index B given to the non-zero signal detection unit 120 is 4, the index of s(5) is p(0)=5.

Next, the non-zero signal detection unit 120 scans the indexes x(k), and finds the negative index x(G) that is most towards the LSB side in the register 112.

In this state, values of the indexes are:
x(0)=0;
x(1)=3;
x(2)=−1;
x(3)=−1;
. . . ;

Therefore the negative index that is most towards the LSB side is $$x(G)=x(2)$$

Next, the non-zero signal detection unit 120 uses the indexes x(k) read from the register 112 and the indexes p(m) obtained from the signals s(n), to update the indexes x(k).

With regard to the indexes x(k) read from the register 112, since the negative index that is most towards the LSB side is $$x(G)=x(2)$$

the non-zero signal detection unit 120 computes the post-update indexes y(k) (k=0, 1, 2, . . . 7) as follows.

y(0)=x(0)=0;
y(1)=x(1)=3;
y(2)=p(2)=5;
y(3)=x(3)=−1;
y(4)=x(4)=−1;
y(5)=x(5)=−1;
y(6)=x(6)=−1;
y(7)=x(7)=−1;

Finally, the non-zero signal detection unit 120 writes the post-update indexes y(k) (k=0, 1, 2, . . . 7) to the register 112.

In the above way, it is possible to obtain the indexes of non-zero signals included in the 8 signals s(n) (n=0, 1, 2, . . . 7).

In the same way, it is possible to obtain the indexes of non-zero signals for 12, 16 or more signals.

Next, a method of obtaining run length using an index of a non-zero signal will be described.

It is possible to compute the number of zeros (run length) appearing before a non-zero signal, from the index of the non-zero signal. The method of computing will be described in the below.

Using the abovementioned method, for N signals s(n) (n=0, 1, . . . N−1), it is assumed that indexes x(k) (k=0, 1, 2, . . . K−1) of non-zero signals are required. However, it is assumed that normal indexes x(k) are 0 or greater and that there is no negative x(k) index.

Furthermore, concerning a normal index 0<=x(k), it is assumed that a relationship holds, as follows:

$$x(k)<=x(k+1) \quad (4)$$

Furthermore, it is assumed that all indexes outside of the normal indexes have a negative value of −N.

In the abovementioned exemplary embodiment, an initial value of x(k) is −1. However, if the initial value of x(k) is negative, any value is possible. Here, in order to obtain the run length, the initial value of x(k) shall be −N.

From the indexes x(k) of non-zero signals, the run lengths x(k) are computed as follows.

x(k) is assigned to a(k).

$$a(k)=x(k) \quad (5)$$

Next, each element of a(k) is shifted by one element in a direction in which the number increases. That is, the values of a(k) are shifted in the following manner:

$$a(k-1)=a(k-2);$$
$$a(k-2)=a(k-3);$$
$$\ldots$$
$$a(3)=a(2);$$
$$a(2)=a(1);$$
$$a(1)=a(0); \quad (6)$$

Then, 0 is assigned to a(0).

Next, the difference between each element of x(k) and an element corresponding to a(k) shall be denoted as b(k). That is, $$b(k)=x(k)-a(k) \quad (7)$$

(k=0, 1, 2, ... K−1)

Next, the sum of each element of b(k) and 2×N shall be denoted as c(k). That is, $$c(k)=b(k)+2\times N \quad (8)$$

(k=0, 1, 2, ... K−1)

Next, a lower log2 (N) bit of each element of c(k) is extracted, and this shall be denoted as d(k). That is, $$d(k)=c(k) \,\&\, ((1<<\log 2(N))-1) \quad (9)$$

(k=0, 1, 2, ... K−1)

In equation (9), & is an AND operator. << is a left shift operator, and a<<b indicates that a is left-shifted by b bits. For example, if N=16, log2(16) is 4, and 1 is subtracted from a result of performing a 4-bit left shift on 0x1 (x is a hexadecimal representation), 0xF is obtained. Thus, if N=16, a value obtained by extracting the lower 4 bits of c(k) is d(k).

Next, the difference between each element of d(k) and 1 shall be denoted as e(k). That is, $$e(k)=d(k)-1 \quad (10)$$

(k=0, 1, 2, ... K−1)

Next, e(k) is assigned to z(k).

$$z(k)=e(k) \quad (11)$$

Then, each element of z(k) is shifted by one element in a direction in which the number decreases. That is, the values of z(k) are shifted in the following manner:

$$z(0)=z(1);$$
$$z(1)=z(2);$$
$$z(2)=z(3);$$
$$\ldots$$
$$z(k-1)=z(k-2); \quad (12)$$

Then, −1 is assigned to z(15).

This z(k) gives run length corresponding to the indexes x(k).

FIGS. 6A to 6H are diagrams respectively, schematically showing an example of obtaining the run lengths z(k) of 16 signals s(n) (n=0, 1, 2, ... 15).

In FIGS. 6A to 6H, the non-zero signals are s(0), s(1), s(2), s(5), s(6), s(9), and s(11).

Assuming that the indexes of non-zero signals x(k) of the signals s(n) are obtained, a specific procedure of obtaining the run lengths z(k) from x(k) based on FIGS. 6A to 6H are described.

First, as described above, the indexes x(k) are obtained from the signals s(n) of FIGS. 6A to 6H.

However, an initial value of x(k) is $$x(k)=-N=-16$$

(k=0, 1, 2, ... K−1)

Figure 6A:
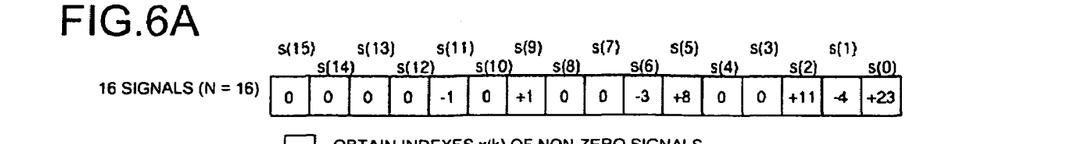
FIGS. 6A to 6H are diagrams for respectively describing a procedure for obtaining a run length from a non-zero signal index, in one exemplary embodiment of the present invention.

In FIG. 6A, 7 non-zero signals are present.

Figure 6B:
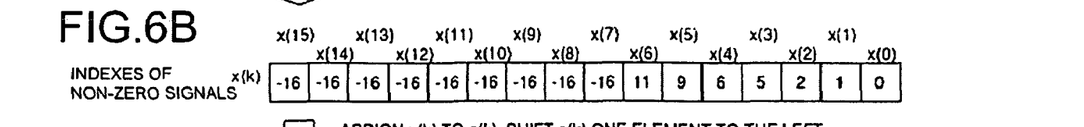

Therefore, values of the indexes x(k) of non-zero signals are obtained as follows:
x(0)=0;
x(1)=1;
x(2)=2;
x(3)=5;
x(4)=6;
x(5)=9;
x(6)=11;
x(7)=−16;
...;

(refer to FIG. 6B).

Figure 6C:
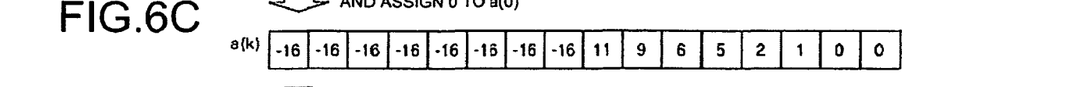

Next, a(k) is obtained from x(k).

If x(k) is shifted by one element in a direction in which the element number k increases, a(k) is obtained.

Therefore, the values of a(k) are as follows:
a(0)=0;
a(1)=0;
a(2)=1;
a(3)=2;
a(4)=5;
a(5)=6;
a(6)=9;
a(7)=11;
a(8)=−16;
...;

(refer to FIG. 6C).

Figure 6D:
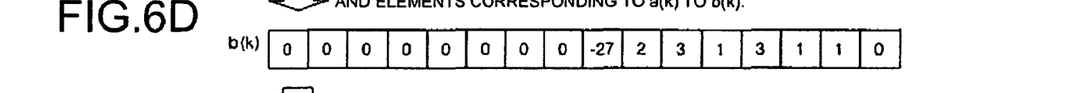

Next, b(k) is obtained from x(k) and a(k).

From b(k)=x(k)−a(k), the values of b(k) are as follows:
b(0)=0;
b(1)=1;
b(2)=1;
b(3)=3;
b(4)=1;
b(5)=3;
b(6)=2;
b(7)=−27;
b(8)=0;
...;

(refer to FIG. 6D).

Figure 6E:
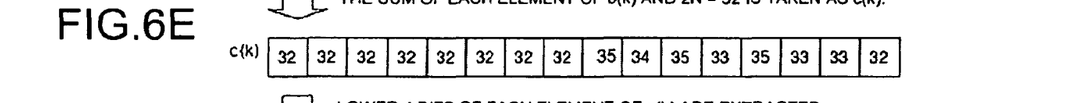

Next, c(k) is obtained from b(k).

From the equation $$c(k)=b(k)+2N$$
$$=b(k)+32$$

the values of c(k) are as follows:
c(0)=32;
c(1)=33;
c(2)=33;
c(3)=35;
c(4)=33;

c(5)=35;
c(6)=34;
c(7)=35;
c(8)=32;
. . . ;

(refer to FIG. 6E).

Figure 6F:
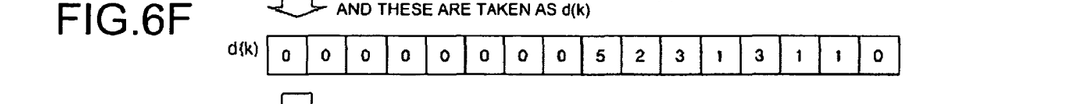

Next, d(k) is obtained from c(k).

From d(k)=c(k) & 0xF, the values of d(k) are as follows:
d(0)=0;
d(1)=1;
d(2)=1;
d(3)=3;
d(4)=1;
d(5)=3;
d(6)=2;
d(7)=5;
d(8)=0;
. . . ;

(refer to FIG. 6F).

Figure 6G:
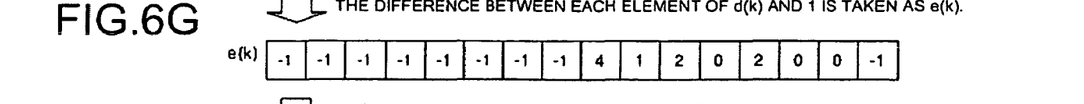

Next, e(k) is obtained from d(k).

From e(k)=d(k)−1, the values of e(k) are as follows:
e(0)=−1;
e(1)=0;
e(2)=0;
e(3)=2;
e(4)=0;
e(5)=2;
e(6)=1;
e(7)=4;
e(8)=−1;
. . . ;

(refer to FIG. 6G).

Figure 6H:
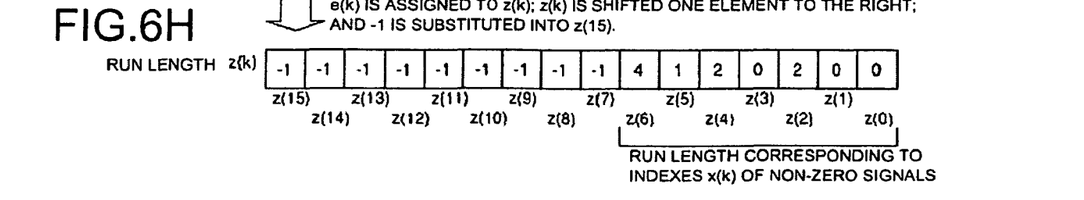

Finally, the run lengths z(k) are obtained from e(k).

If e(k) is shifted by one element in a direction in which the element number k decreases, z(k) is obtained.

Therefore, the values of z(k) are as follows:
z(0)=0;
z(1)=0;
z(2)=2;
z(3)=0;
z(4)=2;
z(5)=1;
z(6)=4;
z(7)=−1;

(refer to FIG. 6H).

z(k) are run lengths corresponding to each element of the indexes x(k) of non-zero signals.

Next, application of the present exemplary embodiment is described.

The processor is not limited to the above described exemplary embodiment, and various applications are possible. Below, a description is given concerning what parts can be specifically applied.

The register file 110 of the processor of the present exemplary embodiment has 16 64-bit registers.

This configuration is one example, and the non-zero signal detection unit 120 can be modified as far as it can work fine.

For example, configurations may be considered such as 32 16-bit registers, 16 32-bit registers, 32 32-bit registers, 64 32-bit registers, 64 64-bit registers, 8 128-bit registers, 16 128-bit registers, 32 128-bit registers, and the like.

The non-zero signal detection unit 120 of the present exemplary embodiment reads signals from the register 111 and indexes from the register 112 respectively, to update the indexes. The updated indexes are written once more to the register 112.

This is one example, and the non-zero signal detection unit 120 can also write the post-update indexes to a different register from the register in which the pre-update indexes are stored.

The non-zero signal detection unit 120 of the present exemplary embodiment uses the register 111 and the register 112. It is also possible to change a register used by the non-zero signal detection unit 120 to another register.

For example, if the register used by the non-zero signal detection unit 120 is described in an instruction word, it is possible to change the register used by the non-zero signal detection unit 120 according to an instruction.

The non-zero signal detection unit 120 of the present exemplary embodiment reads signals from the register 111. It is also possible to read signals from a plurality of registers.

For example, it is possible to divide and store the N signals to several registers, and the non-zero signal detection unit 120 can read signals from these registers.

The non-zero signal detection unit 120 of the present exemplary embodiment reads indexes from the register 112. It is also possible to read indexes from a plurality of registers.

For example, it is possible to divide and store the K indexes among several registers, and the non-zero signal detection unit 120 can read indexes from these reregisters. In the same way, the non-zero signal detection unit 120 of the exemplary embodiment writes the updated indexes to the register 112. It is also possible to write the indexes to a plurality of registers.

The present invention can be applied to any apparatus that encodes information using run-length encoding. For example, it is possible to encode an image or music using an encoder to which the present invention is applied.

A description has been given above according to the above-mentioned exemplary embodiments of the present invention, but the present invention is not limited to only configurations of the abovementioned exemplary embodiments, and clearly includes every type of transformation and modification that a person skilled in the art can realize within the scope of the present invention.

What is claimed is:

1. An encoding apparatus for performing run-length encoding of signals that are to be encoded, the encoding apparatus comprising:
    a first storage unit that stores signals to which indexes are given in order to distinguish each of a plurality of signals that are to be encoded;
    a second storage unit that stores indexes of non-zero signals;
    a first index computing unit that computes first indexes of non-zero signals among the signals stored in the first storage unit;
    a second index computing unit that computes second indexes from a base index and the first indexes;
    a second index storage position search unit that searches for a storage position in the second storage unit in which the second indexes are to be stored, based on values of indexes stored in the second storage unit;
    a second index preserving unit that preserves the second index in the second storage unit, based on a storage position searched for by the second index storage position search unit; and
    a control unit that gives the base index to the second index computing unit, and that controls operation of each of the first index computing unit, the second index computing unit, the second index storage position search unit, and the second index preserving unit.

2. The encoding apparatus according to claim 1, wherein the second index storage position search unit comprises
a unit that searches for a storage position such that the second indexes are stored in ascending order or descending order in the second storage unit.

3. The encoding apparatus according to claim 2, further comprising:
a unit that computes a difference between adjacent elements of indexes of non-zero signals stored in the second storage unit; and
a unit that obtains the number of zeros before a non-zero signal by subtracting 1 from the difference between the elements.

4. A processor comprising an encoding apparatus according to claim 1.

5. A processor comprising: a register file, a non-zero signal detection unit, and an instruction decoder, wherein
indexes of from 0 to S−1 are assigned to S signals on which run-length encoding is to be performed, and N (where N is an integer that is less than or equal to S and greater than or equal to 2) signals s(n) (n=0 to N−1) extracted from the S signals are stored in a first register of the register file,
with the index of signal s(0) of the N signals as a base index,
K (where K is a positive integer smaller than the total number of S signals) initialized indexes x(k) (k=0 to K−1) are stored in advance in a second register of the register file,
when a decoded instruction is a non-zero signal detection instruction, the instruction decoder makes the non-zero signal detection unit operate,
the instruction decoder gives the base index to the non-zero signal detection unit, and
the non-zero signal detection unit comprises:
a first unit for reading signals s(n) (n=0 to N−1) from the first register of the register file, and computing indexes p(m) (m=0 to M−1, M is the number of non-zero signals included in the signals s(n)) of non-zero signals included in the signals s(n), using the base index;
a second unit for using the indexes x(k) (k=0 to K−1) stored in the second register of the register file and the indexes p(m) of the non-zero signals, to have post-update indexes y(k) (k=0 to K−1) obtained by appending the p(m) to the x(k); and
a third unit for writing the post-update indexes y(k) (k=0 to K−1) to the second register.

6. The processor according to claim 5, wherein the second unit has a negative index x(k), in which k is smallest in the indexes x(k) (k=0 to K−1), as x(G), and has the post-update indexes y(k) (k=0 to K−1) as,
in case of 0<=k<G,
y(k)=x(k);
in case of G<=k<(G+M),
y(k)=p(k−G); and
in case of (G+M)<=k<K,
y(k)=x(k).

7. The processor according to claim 5, for repeating processing in which:
S signals that are to be encoded are divided into L sets, each of which includes N signals;
a prescribed value is stored in the second register and the indexes x(k) are initialized;
with a variable i=0, while incrementing i by 1 from 0 to L−1, an i-th of N signals s(n) (n=0 to N−1) are stored in the first register;
with the base index as N×i, the non-zero signal detection unit is made to operate; and
an index of a non-zero signal of the signals s(n) stored in the first register is added to the second register.

8. The processor according to claim 5, wherein for indexes x(k) of non-zero signals of the signals s(n), with x(k) shifted by 1 element in a direction in which a number k becomes larger, as a(k),
a difference between x(k) and a(k), b(k)=x(k)−a(k) (k=0 to N−1), is obtained,
next, a sum of 2×N from b(k), c(k)=b(k)+2×N (k=0 to N−1), is obtained,
next, with a result of extracting a prescribed lower bit of c(k) as d(k),
e(k)=d(k)−1 (k=0 to N−1) is obtained, and
with e(k) being shifted by 1 element in a direction in which a number k becomes smaller, as z(k), z(k) is a run length corresponding to each element of x(k).

9. An encoding method for run-length encoding of signals that are to be encoded, the method comprising:
computing first indexes of non-zero signals among the signals that are stored in a first storage unit for storing signals to which indexes are given in order to distinguish each of a plurality of signals that are to be encoded;
computing second indexes from a base index and the first indexes;
searching, based on values of indexes stored in a second storage unit that stores indexes, for a storage position in the second storage unit in which the second indexes are to be stored;
preserving the second index in the second storage unit, based on a storage position searched for in the search of the second index storage position; and
providing the base index used in computing the second index, and controlling operation of each of computing the first index, computing the second index, searching for the second index storage position, and storing the second index.

10. The encoding method according to claim 9, wherein
in searching the second index storage position, a search is made for a storage position such that the second indexes are stored in ascending order or descending order in the second storage unit.

11. The encoding method according to claim 10, comprising
computing a difference between adjacent elements of indexes of non-zero signals stored in the second storage unit, and
obtaining the number of zeros before a non-zero signal by subtracting 1 from the difference between the elements.

12. A program stored in a computer-readable record medium for causing a computer which performs run-length encoding of signals to execute the following processing, comprising:
computing first indexes of non-zero signals among the signals that are stored in a first storage unit for storing signals to which indexes are given in order to distinguish each of a plurality of signals that are to be encoded;
computing second indexes from a base index and the first indexes;
storage position searching for a storage position in a second storage unit in which the second indexes are to be stored, based on values of indexes stored in the second storage unit for storing indexes;

preserving the second index in the second storage unit, based on a storage position searched for in the search of the second index storage position; and providing the base index used in the second index computing processing and controlling operation of each of the first index computing processing, the second index computing processing, the second index storage position search processing, and the second index preserving processing.

13. The program according to claim 12, wherein
in the second index storage position search processing, a search is made for a storage position such that the second indexes are stored in ascending order or descending order in the second storage unit.

14. The program according to claim 13, for causing the computer to execute the processing comprising:

computing a difference between adjacent elements of indexes of non-zero signals stored in the second storage unit, and obtaining the number of zeros before a non-zero signal by subtracting 1 from the difference between the elements.

* * * * *